United States Patent
An et al.

(10) Patent No.: US 9,806,132 B2
(45) Date of Patent: Oct. 31, 2017

(54) ORGANIC X-RAY DETECTOR WITH BARRIER LAYER

(71) Applicant: General Electric Company, Schenectady, NY (US)

(72) Inventors: Kwang-Hyup An, Rexford, NY (US); Aaron Judy Couture, Schenectady, NY (US); Gautam Parthasarathy, Niskayuna, NY (US); Ri-An Zhao, Niskayuna, NY (US); Jie Jerry Liu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 508 days.

(21) Appl. No.: 14/087,774

(22) Filed: Nov. 22, 2013

(65) Prior Publication Data

US 2015/0144889 A1    May 28, 2015

(51) Int. Cl.

| | | |
|---|---|---|
| *H01L 27/30* | (2006.01) | |
| *G01T 1/20* | (2006.01) | |
| *H01L 27/146* | (2006.01) | |
| *H01L 51/00* | (2006.01) | |
| *H01L 51/44* | (2006.01) | |
| *H01L 27/28* | (2006.01) | |

(52) U.S. Cl.
CPC .......... *H01L 27/308* (2013.01); *G01T 1/2018* (2013.01); *H01L 27/14663* (2013.01); *H01L 51/0097* (2013.01); *H01L 51/447* (2013.01); *H01L 51/448* (2013.01); *H01L 27/283* (2013.01); *Y02E 10/549* (2013.01); *Y02P 70/521* (2015.11)

(58) Field of Classification Search
CPC ................ H01L 27/308; H01L 51/447; H01L 27/14663; H01L 51/0097; H01L 51/448; H01L 27/283; G01T 1/2018
See application file for complete search history.

(56) References Cited

U.S. PATENT DOCUMENTS

| | | | |
|---|---|---|---|
| 6,204,905 B1 * | 3/2001 | Koma | G02F 1/134309 349/123 |
| 6,344,889 B1 * | 2/2002 | Hasegawa | G02F 1/141 349/129 |
| 6,455,443 B1 * | 9/2002 | Eckert | H01L 21/02126 257/E21.259 |
| 6,522,067 B1 | 2/2003 | Graff et al. | |
| 7,005,648 B2 | 2/2006 | Baumgartner et al. | |
| 8,236,424 B2 | 8/2012 | Schaepkens et al. | |

(Continued)

FOREIGN PATENT DOCUMENTS

DE    102006015043 A1    10/2007

OTHER PUBLICATIONS

PCT Search Report and Written Opinion issued in connection with corresponding PCT Application No. PCT/US2014/054562 dated Nov. 18, 2014.

*Primary Examiner* — David Vu

(74) *Attorney, Agent, or Firm* — Pabitra K. Chakrabarti

(57) ABSTRACT

An organic x-ray detector and a method of making the organic x-ray detector are disclosed. The x-ray detector includes a TFT array disposed on a substrate, an organic photodiode layer disposed on the TFT array, a barrier layer disposed on the photodiode layer, and a scintillator layer disposed on the barrier layer, such that the barrier layer includes at least one inorganic material.

18 Claims, 4 Drawing Sheets

(56) References Cited

U.S. PATENT DOCUMENTS

| | | | |
|---|---|---|---|
| 2002/0094699 A1* | 7/2002 | Houng | H01L 21/28264 |
| | | | 438/779 |
| 2003/0207500 A1 | 11/2003 | Pichler et al. | |
| 2004/0229051 A1 | 11/2004 | Schaepkens et al. | |
| 2005/0093031 A1* | 5/2005 | Akkerman | H01L 51/0036 |
| | | | 257/288 |
| 2005/0095839 A1* | 5/2005 | Chang | H01L 21/02137 |
| | | | 438/623 |
| 2008/0142721 A1 | 6/2008 | Spahn | |
| 2009/0152563 A1* | 6/2009 | Hayashi | H01L 27/14692 |
| | | | 257/72 |
| 2009/0166512 A1* | 7/2009 | Furst | B82Y 10/00 |
| | | | 250/208.1 |
| 2009/0180045 A1* | 7/2009 | Yoon | G02F 1/1368 |
| | | | 349/43 |
| 2012/0001282 A1 | 1/2012 | Goto et al. | |
| 2013/0048863 A1 | 2/2013 | Ohta et al. | |
| 2013/0126915 A1 | 5/2013 | Chan et al. | |

\* cited by examiner

ORGANIC X-RAY DETECTOR WITH BARRIER LAYER

BACKGROUND

Digital x-ray detectors fabricated with continuous photodiodes have potential applications for low cost digital radiography as well as for rugged, light-weight and portable detectors. Digital x-ray detectors with continuous photodiodes have an increased fill factor and potentially higher quantum efficiency. The continuous photodiode generally includes organic photodiodes (OPDs). A scintillator which converts x-ray to visible light is generally disposed on top of the OPDs.

During the post OPD process such as disposing the scintillator, encapsulation, laser repair process, or operation, OPD has a high chance of exposure to air. Most organic based photodiodes are sensitive to oxygen and moisture, and hence need to be protected from the moisture-containing air. Therefore, there is a need for a barrier for the OPDs that would protect the OPD from even the oxygen and moisture content from the scintillator during the deposition process and operation.

BRIEF DESCRIPTION

The present invention meets these and other needs by providing a barrier between the OPD layer and the moisture and oxygen, from scintillator. The organic x-ray detector includes a substrate, a thin film transistor (TFT) layer, a barrier layer, and an OPD.

Accordingly, in one aspect, the invention relates to an organic x-ray detector. The x-ray detector includes a TFT array disposed on a substrate, an organic photodiode layer disposed on the TFT array, a barrier layer disposed on the photodiode layer, and a scintillator layer disposed on the barrier layer, such that the barrier layer comprises at least one inorganic material.

In another aspect, the invention relates to an organic x-ray detector including a TFT array, an organic photodiode layer, electrodes, a planarization layer, a barrier layer, an adhesion layer, a scintillator layer, and an additional barrier layer. The TFT array is disposed on the substrate and the organic photodiode layer is disposed on the TFT array. A first electrode is disposed between the TFT array and the photodiode layer and a second electrode is disposed over the photodiode layer. The planarization layer is disposed on the second electrode, and the barrier layer is disposed on the planarization layer. An adhesion layer is disposed between the barrier layer and the scintillator layer and an additional barrio layer is disposed on the scintillator layer. Both the barrier layer and the additional barrier layer include at least one inorganic material.

In yet another aspect, the invention relates to a method of making an organic x-ray detector. The steps of making the organic x-ray detector include disposing a TFT array on a substrate, disposing an organic photodiode layer on the TFT array, disposing a planarization layer on the photodiode layer, disposing a barrier layer comprising at least one inorganic material on the planarization layer, and disposing a scintillator layer on the barrier layer.

DETAILED DESCRIPTION

Figure 1:
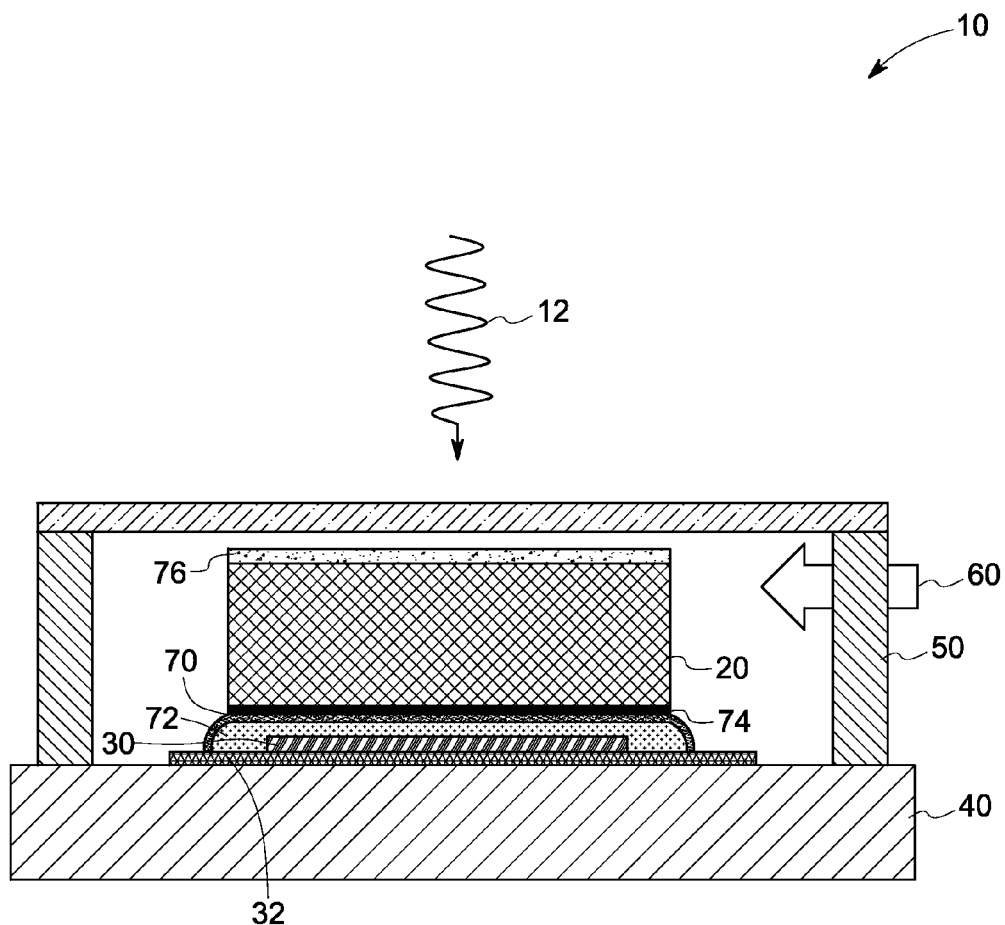
FIG. 1 is a schematic representation of an organic x-ray detector, according to one embodiment of the present invention.

In the following description, like reference characters designate like or corresponding parts throughout the several views shown in the figures. It is also understood that terms such as "top," "above," "over," "on," and the like are words of convenience and are not to be construed as limiting terms.

Electro-optical devices, such as, but not limited to, organic x-ray detectors include an electronically or optically active portion—e.g., scintillators and photodiodes that are frequently disposed on a substrate. In order to protect the active portion and the substrate from degradation due to exposure to moisture, oxygen, or corrosive chemical attack, the electro-optical devices are normally encased in a seal.

One aspect of the invention is to provide an electro-optical device, such as, but not limited to, organic x-ray detectors. A schematic representation of such an electro-optical device is shown in FIG. 1. An organic x-ray detector 10 includes a scintillator layer 20 that is excited by impinging x-ray 12 and produces visible light. The scintillator layer 20 may be a monolithic scintillator or pixelated scintillator array. GOS ($Gd_2O_2S$) is a commonly used low cost scintillator, which is in the form of thin film with millimeter range thickness. Cesium Iodide (CsI) is another scintillator material that can be used for a high sensitivity scintillator, and may be deposited by thermal evaporation. Another scintillator that may be used is a PIB (particle in binder) scintillator, where scintillating particles may be incorporated in a binder matrix material and flattened on a substrate. The visible light generated by the scintillator irradiates an organic photodiode layer 30 disposed on a thin film transistor (TFT) array 32.

Depending on the application and variations in design, the photodiode layer 30 may be a single organic layer or may include multiple organic layers. Further, the photodiode layer 30 may be directly disposed on the TFT array 32 or the design may include one or more layers disposed between the photodiode layer 30 and the TFT array 32.

The visible light impinged on the photodiode layer partially discharges capacitance of the diodes. The amount of photodiode discharge is proportional to the quantity of incident light. Each pixel of the TFT array incorporates a switching field effect transistor (FET) used to control when charge is restored to the photodiode capacitance. The charge required to restore the capacitance is provided and measured by external charge measurement circuitry. This circuitry, coupled with the TFT array, allows sequential scanning and readout of all photodiodes in the array. A custom A/D integrator/converter is normally used to measure the charge required to restore the photodiode to its initial un-discharged state. The magnitude of the discharge is proportional to the incident x-ray dose at each pixel integrated by both the scintillator layer 20 and the photodiode layer 30 during the length of the x-ray exposure. The final x-ray image is reconstructed pixel-by-pixel using the photodiode layer 30 discharge levels to set the image pixel intensity.

The TFT array 32 is disposed on a substrate 40. Suitable substrate 40 materials include glass, ceramics, plastics and metals. The substrate 40 may be present as a rigid sheet such as a thick glass, a thick plastic sheet, a thick plastic composite sheet, and a metal plate, or a flexible sheet such as a thin glass sheet, a thin plastic sheet, a thin plastic composite sheet, and metal foils. As used herein, a "flexible substrate" is a substrate that can be bent to a radius equal to or less than about 1 centimeter, without any fracture that affects the performance of the substrate 40. In one particular embodiment, the flexible substrate includes a polycarbonate. The scintillator 20, the photodiode layer 30, and the TFT array 32 are enclosed inside a seal 50 to protect from the moisture and oxygen 60 introduced from atmosphere.

In one embodiment of the invention, apart from being protected from the external moisture and oxygen 60, the photodiode layer 30 is further protected from the moisture and oxygen that may be introduced from the scintillator layer 20 during the formation or during the operation. A bather layer 70 is disposed on the photodiode layer 30 for providing this protection.

In one embodiment, the device 10 may further include a planarization layer 72 (FIG. 1) sandwiched between the barrier layer and the photodiode layer. A planarization layer provides a smooth surface for the barrier layer 70 so that the diffusion barrier layer 70 on top of the planarization layer works without any pinhole defect. The planarization layer 72 may be composed of a poly carbonate, an epoxy polymer or acrylate based material. The planarization layer 72 may further include a photo initiator. The planarization layer may be disposed by different methods, such as for example, solution coating, spin coating, slot die or blade coating, or screen printing. In one embodiment, the planarization layer is disposed using solution coating. The planarization layer 72 may further etched to form a gradual edge profile for better sealing.

The barrier layer 70 used herein includes at least one inorganic material. The inorganic material may include silicon, a metal oxide, a metal nitride, or combinations thereof, wherein the metal is one of indium, tin, zinc, titanium, and aluminum. In one embodiment, the inorganic material of the barrier layer 70 includes indium tin oxide, silicon oxide, silicon nitride, aluminum oxide, or any combinations thereof. In another embodiment, the barrier layer 70 may include indium zinc oxide, silicon oxynitride, aluminum nitride, aluminum oxynitride, zinc oxide, indium oxide, tin oxide, cadmium tin oxide, cadmium oxide, or magnesium oxide.

In one embodiment, the barrier layer 70 includes at least one organic material, in addition to the at least one inorganic material. The organic material of the barrier layer 70 may include at least one material selected from the group consisting of a parylene, a siloxane, a xylene, an alkene, a styrene, an organosilane, an organosilazane, and an organosilicone.

In one embodiment, the barrier layer 70 includes a multilayer comprising at least one layer of organic material and one layer of inorganic material. In a further embodiment, a multilayer having a set of alternate organic layer and inorganic layer (not shown) may be present as the barrier layer 70. The barrier layer 70 may include a plurality of inorganic layers and organic layers that are alternately arranged. Alternatively, organic layers may be separated by a plurality of consecutively stacked inorganic layers, or inorganic layers may be separated by a plurality of consecutively stacked organic layers. Further, the organic and inorganic layers of the multilayer barrier layer 70 may be graded in their composition, density, or thickness to accommodate various design requirements and performance optimization. In one embodiment, for example, the barrier layer may have a hybrid inorganic/organic composition comprising a single barrier layer having a graded composition that gradually transitions from a pure inorganic layer to a pure organic layer.

The inorganic layer of the barrier layer 70 serves as a radiation absorbent layer, a moisture barrier layer, an oxygen barrier layer, an electrically conductive layer, an anti-reflective layer, or combinations thereof. The organic layer of the barrier layer 70 may include at least one of an adhesion layer, a stress relief layer, a conformal layer, a chemically resistant layer, an abrasion resistant layer, and combinations thereof.

In one embodiment, barrier layer 70 comprises an inorganic multilayer coating and at least one organic layer. A first inorganic layer deposited on a smooth planarization layer 72 may have good adhesion and matching coefficient of thermal expansion (CTE) with the planarization layer 72. A second inorganic layer deposited on the first inorganic layer may have intrinsically good oxygen and moisture bather properties. The second inorganic layer differs chemically and physically from the first inorganic layer. The adhesion and CTE matching properties of the first inorganic layer may serve to increase the barrier performance of the second inorganic layer. A polymeric organic layer deposited on top of the second inorganic layer may act as a smoothing layer and may protect the first and second inorganic layers from chemical attack during processing. A third inorganic layer may have good adhesion and CTE matching properties with the organic layer, and a fourth inorganic layer may have intrinsically good oxygen and moisture barrier properties. In addition to simultaneously optimizing barrier and adhesion performance, barrier layer 70 may be designed to simultaneously meet demands on thermal, mechanical, dimensional, and optical performance.

The barrier layer 70 may have a thickness in the range from about 0.05 micron to about 50 microns. In one embodiment, the thickness of barrier layer 70 is in the range from about 0.1 micron to about 10 microns. The thickness of the individual layers in the bather layer 70 may depend in part on the function of and the material comprising the individual layer, and is balanced to optimize performance of individual layers while maximizing the adhesion and flexibility of the barrier layer 70.

Barrier layer 70 is substantially transparent to light in the visible portion of the spectrum so that substantially all the visible light produced from the scintillator layer 20 reaches the photodiode layer 30 and get registered. In one embodiment, barrier layer 70 has a transmission of at least about 85% and a Taber haze value of less than about 5% after 1000 cycles.

The bather layer 70 with or without the planarization layer 72 is disposed to protect the photodiode layer 30 from the moisture and oxygen content, and hence protects the photodiode layer from the top and on the sides. In one embodiment, the barrier layer 70 is further disposed at least partially on the TFT array 32 or the substrate 40, so that a seal between the barrier layer 70 and the TFT array 32 or the substrate 40 protects the photodiode layer 30. The "seal between the barrier layer 70 and the TFT array 32 or the substrate 40 as used herein does not involve any other sealing material, other than in some cases, the planarization layer 72 as discussed below in detail.

Figure 2:
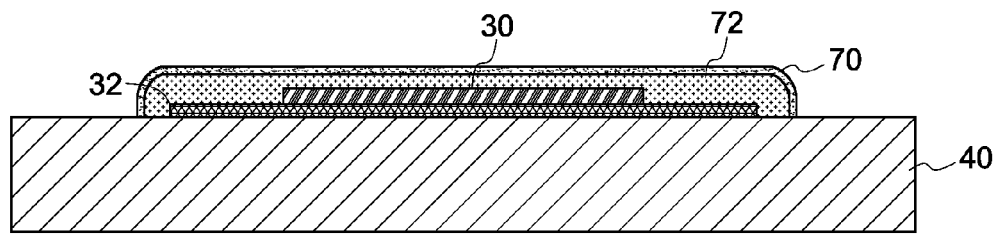
FIG. 2 is a schematic representation of a planarization layer and barrier layer, according to one embodiment of the present invention.

Accordingly, in one embodiment, the as shown in FIG. 2, the planarization layer 72 is completely covered by the barrier layer, and the barrier layer 70 seals directly with the substrate 40, along with a seal of the planarization layer 72 with the TFT array 32 and the substrate 40.

Figure 3:
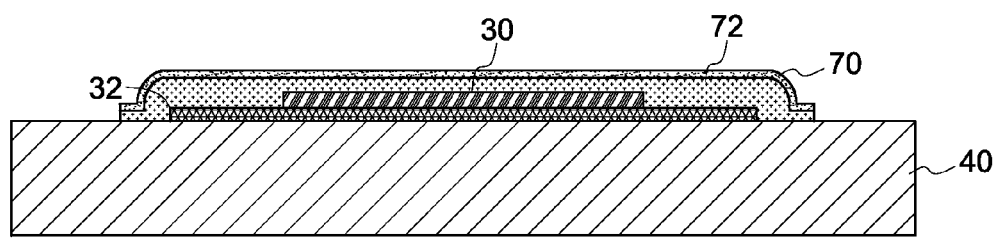
FIG. 3 is a schematic representation of a planarization layer and barrier layer, according to one embodiment of the present invention.

In one embodiment, as shown in FIG. 3, the planarization layer 72 seals with the TFT array 32 and the substrate 40 without the bather layer 70 touching the substrate 40.

Figure 4:
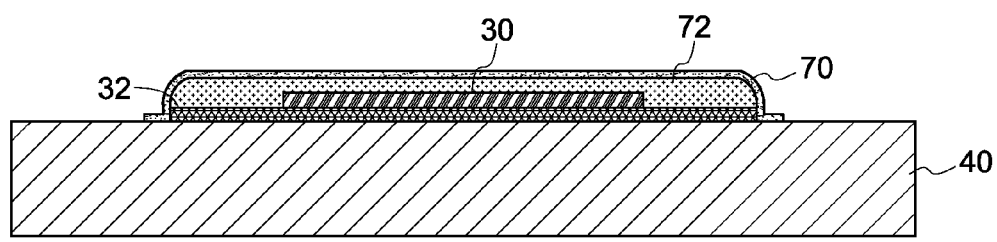
FIG. 4 is a schematic representation of a planarization layer and barrier layer, according to one embodiment of the present invention.

In an alternate arrangement, as shown in FIG. 4, the planarization layer 72 seals with the TFT array 32, and the bather layer 70 seals with the TFT array 32 and the substrate 40, without the planarization layer touching the substrate 40.

Figure 5:
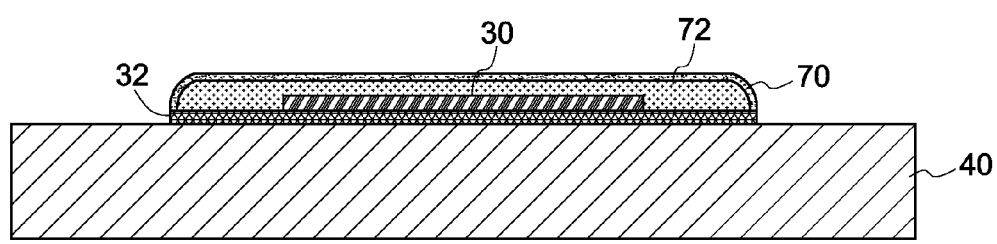
FIG. 5 is a schematic representation of a planarization layer and barrier layer, according to one embodiment of the present invention.

In a further alternate arrangement, as shown in FIG. 5, both the planarization layer 72 and the barrier layer 70 seal with the TFT array 32 without touching the substrate 40.

Figure 6:
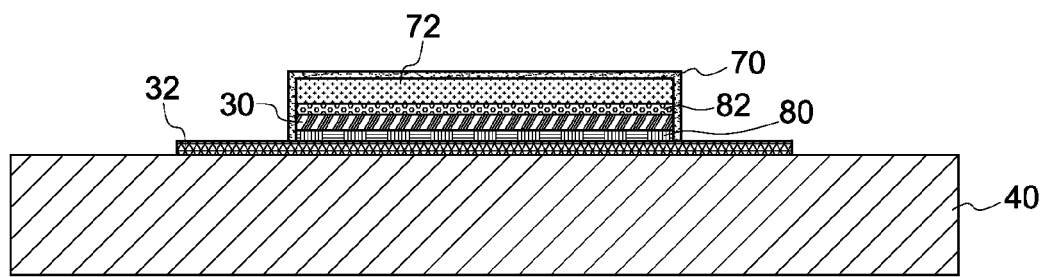
FIG. 6 is a schematic representation of a cathode layer and barrier layer, according to one embodiment of the present invention.

In one embodiment, an external charge measurement circuitry is involved in providing and measuring the required charge to restore the capacitance. To complete this circuitry, in one embodiment, a first electrode 80 is disposed between the TFT array 32 and the photodiode layer 30 and a second electrode 82 is disposed between the photodiode layer 30 and the barrier layer 70 as shown in FIG. 6. One of the first 80 and second 82 electrodes may be anode and another one is a cathode. In one embodiment, the first electrode 80 is an anode and the second electrode 82 is a cathode. The anode 80 and cathode 82 may be including a metal oxide layer. In one embodiment, the cathode 82 includes an indium tin oxide layer.

Figure 7:
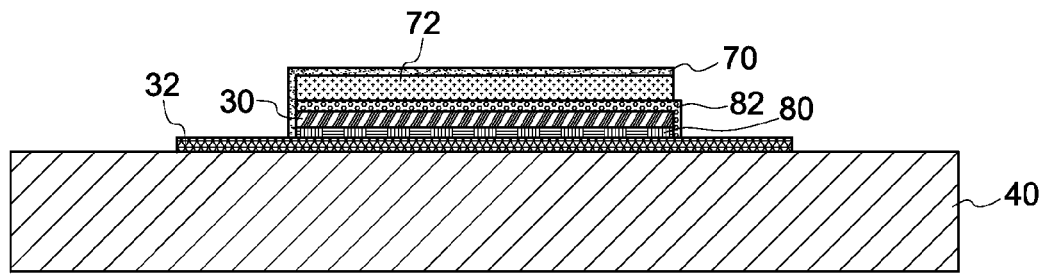
FIG. 7 is a schematic representation of a cathode layer and barrier layer, according to one embodiment of the present invention.
Figure 8:
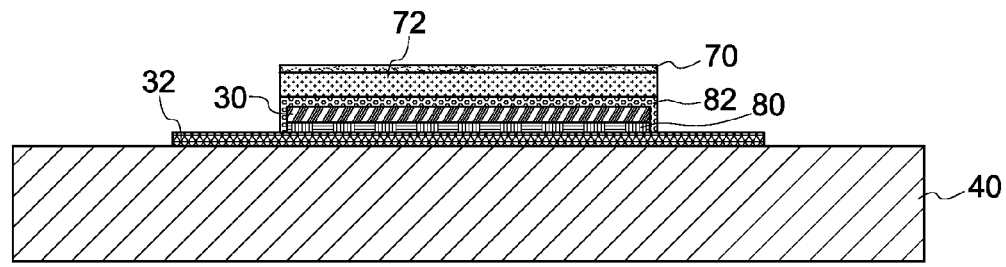
FIG. 8 is a schematic representation of a cathode layer and barrier layer, according to one embodiment of the present invention.
Figure 9:
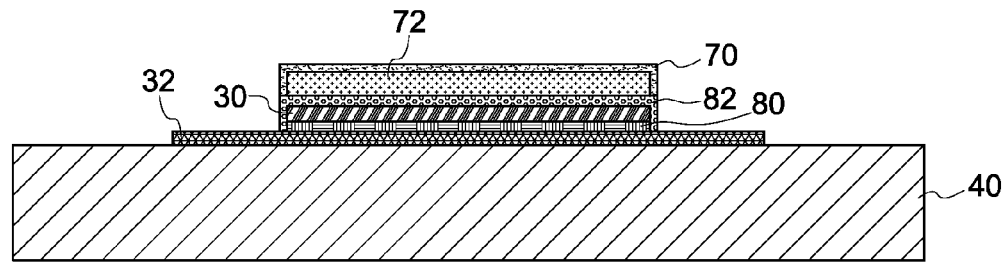
FIG. 9 is a schematic representation of a cathode layer and barrier layer, according to one embodiment of the present invention.
Figure 10:
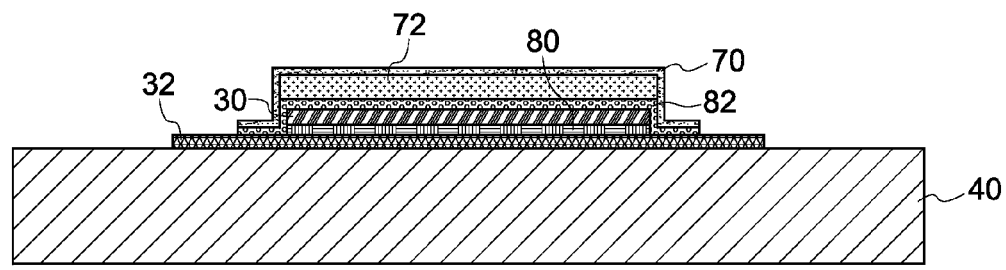
FIG. 10 is a schematic representation of a cathode layer and barrier layer, according to one embodiment of the present invention.

The cathode layer 82, disposed in between the photodiode layer 30 and the barrier layer 70 (or the planarization layer 72), may further be used as a barrier for moisture and oxygen to protect the photodiode layer 30 as shown in different embodiments depicted in FIG. 6, 7, 8, 9, or 10. In FIG. 6, the cathode layer 82 provides a top protection to the photodiode layer 30, while the barrier layer 70 provides the protection from moisture and oxygen for the edge portion of the photodiode layer 30. In FIG. 7, the cathode layer 82 protects an edge portion and top portion of the photodiode layer 30, while the barrier layer 70 protects another edge portion of the photodiode layer 30. In FIG. 8, the cathode layer 82 protects the top portion as well as the edge portions of the photodiode layer 30. In FIG. 9, the cathode layer 82 protects the top portion as well as the edge portions of the photodiode layer 30, and further electrically coupled to the barrier layer 70. FIG. 10 is alternate embodiment of FIG. 9, wherein the cathode layer 82 protects the top portion as well as the edge portions of the photodiode layer 30, and further the barrier layer 70 covers the planarization layer 72 and the cathode layer 82. While FIGS. 6-10 depict some of the envisaged use of the cathode layer 82 and the barrier layer 70 together, one skilled in the art would understand that depending on the shape, size, and relative positions of the different layers, there can be many combinations of cathode layer 82 and the barrier layer 70 to protect the photodiode layer 30.

As envisaged for the barrier layer 70 depicted in FIGS. 2-6, the cathode layer 82 may further disposed on the TFT array 32 or the substrate 40. In one embodiment, the cathode layer 82 is disposed on the TFT array 32 and the substrate 40 (not shown). In a variation of the design of the organic x-ray detector, there may be an adhesive layer 74 between the scintillator layer 20 and the barrier layer 70 as shown in FIG. 1. Further, there may be an additional barrier layer 76 disposed on the scintillator layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An organic x-ray detector, comprising:
a TFT array disposed on a substrate;
an organic photodiode layer disposed on the TFT array;
a first electrode disposed in between the TFT array and the organic photodiode layer;
a barrier layer disposed on the organic photodiode layer, wherein the barrier layer comprises at least one inorganic material;
a planarization layer sandwiched between the barrier layer and the organic photodiode layer, wherein the planarization layer comprises a poly carbonate, an epoxy polymer, or an acrylate based material;
a second electrode disposed in between the organic photodiode layer and the planarization layer, wherein the second electrode is further disposed on edge portions of the photodiode layer; and
a scintillator layer disposed on the barrier layer.

2. The organic x-ray detector of claim 1, wherein the barrier layer is further disposed on the TFT array or the substrate.

3. The organic x-ray detector of claim 1, wherein the second electrode is further disposed on the TFT array or the substrate.

4. The organic x-ray detector of claim 1, wherein the at least one inorganic material comprises at least one of an indium tin oxide, a silicon oxide, a silicon nitride, and an aluminum oxide.

5. The organic x-ray detector of claim 1, wherein the barrier layer comprises at least one organic material.

6. The organic x-ray detector of claim 5, wherein the at least one organic material comprises at least one of a parylene, a siloxane, a xylene, an alkene, a styrene, an organosilane, an organosilazane, and an organosilicone.

7. The organic x-ray detector of claim 5, wherein the barrier layer comprises at least one set of alternate organic material layer and inorganic material layer.

8. The organic x-ray detector of claim 5, wherein the barrier layer comprises a graded organic and inorganic layer.

9. The organic x-ray detector of claim 1, wherein the barrier layer is substantially transparent to visible light.

10. The organic x-ray detector of claim 1, further comprising an adhesive layer between the scintillator layer and the barrier layer.

11. The organic x-ray detector of claim 1, further comprising an additional barrier layer disposed on the scintillator layer.

12. The organic x-ray detector of claim 1, wherein the substrate is flexible.

13. An organic x-ray detector, comprising:
a TFT array disposed on a substrate;
a first electrode disposed on the TFT array;
an organic photodiode layer disposed on the first electrode;
a second electrode disposed on the organic photodiode layer, wherein the second electrode is further disposed on edge portions of the organic photodiode layer;
a planarization layer disposed on the second electrode;
a barrier layer disposed on the planarization layer;
an adhesion layer disposed on the barrier layer;
a scintillator layer disposed on the adhesion layer; and
an additional barrier layer disposed on the scintillator layer, wherein
the barrier layer and the additional barrier layer comprise at least one inorganic material, and wherein the planarization layer comprises a poly carbonate, an epoxy polymer, or an acrylate based material.

14. The organic x-ray detector of claim 13, wherein the second electrode is further disposed on the TFT array or on the substrate.

15. The organic x-ray detector of claim 13, wherein the second electrode is disposed on the TFT array and on the substrate.

16. The organic x-ray detector of claim 15, wherein the barrier layer is electrically coupled to the second electrode.

17. A method of making an organic x-ray detector, the method comprising steps of:
disposing a TFT array on a substrate;
disposing an organic photodiode layer on the TFT array;
disposing a first electrode in between the TFT array and the organic photodiode layer;
disposing a planarization layer on the organic photodiode layer by a solution deposition method;
disposing a second electrode in between the organic photodiode layer and the planarization layer, wherein disposing the second electrode further comprises disposing the second electrode on edge portions of the organic photodiode layer;
disposing a barrier layer on the planarization layer; and
disposing a scintillator layer on the barrier layer, wherein the barrier layer comprises at least one inorganic material and wherein the planarization layer comprises a polycarbonate, an epoxy polymer, or an acrylate based material.

18. The method of claim 17, further comprising electrically coupling the second electrode to the barrier layer.

* * * * *